United States Patent [19]

Balmer

[11] Patent Number: 4,956,850

[45] Date of Patent: Sep. 11, 1990

[54] DIGITAL ELECTRONIC SYSTEM

[75] Inventor: Keith Balmer, Bedford, England

[73] Assignee: Texas Instruments Incorporated, Dallas, Tex.

[21] Appl. No.: 278,710

[22] Filed: Dec. 1, 1988

[30] Foreign Application Priority Data

Dec. 1, 1987 [GB] United Kingdom ............... 8728065

[51] Int. Cl.⁵ .................... H04L 25/20; H04L 25/52
[52] U.S. Cl. ...................................... 375/3; 178/71 R
[58] Field of Search ................. 375/3, 4; 370/85, 86, 370/88, 97, 75, 31, 85.9, 85.13, 85.14; 178/71 R, 71 A, 71 B, 71 C, 71 D, 71 E, 71 F, 71 G, 71 H, 71 J, 71 K, 71 L, 71 M, 71 N, 71 S, 71 P, 71 Q, 71 T

[56] References Cited

U.S. PATENT DOCUMENTS

| | | | |
|---|---|---|---|
| 3,832,489 | 8/1974 | Krishna | 178/71 R |
| 4,099,024 | 7/1978 | Boggs et al. | 370/85 |
| 4,154,978 | 5/1979 | Tu | 178/71 R |
| 4,577,327 | 3/1986 | Nambu | 178/71 R |
| 4,598,410 | 7/1986 | Smith et al. | 375/3 |
| 4,700,342 | 10/1987 | Egami | 370/85 |
| 4,726,034 | 2/1988 | Schillhof et al. | 375/3 |
| 4,811,195 | 3/1989 | Evans | 375/3 |

Primary Examiner—Douglas W. Olms
Assistant Examiner—Wellington Chin
Attorney, Agent, or Firm—William E. Hiller; N. Rhys Merrett; Melvin Sharp

[57] ABSTRACT

A bus interconnecting a plurality of digital modules is divided into sections interconnected by buffers so that the loading on the drive circuits of the modules is reduced. Unidirectional buffers can be used where a bus section is connected only to modules driving the bus section or only to modules receiving signals from the bus section. A bidirectional buffer is clocked so that it is only capable of signal transmission in either direction during a clock pluse, thereby eliminating the regenerative feedback which would cause the buffer to hold a signal value. The logical sense of signals used by the bus sections may all be the same or some sections may use signals of the opposite logical sense; inverting and non-inverting buffers are used as required. A gated buffer may be provided enabling signal transmission from one bus section to another to be blocked. The modules, bus and buffers may be formed as an integrated circuit.

8 Claims, 2 Drawing Sheets

DIGITAL ELECTRONIC SYSTEM

TECHNICAL FIELD OF THE INVENTION

This invention relates to a digital electronic system and in particular to such a system which uses one or more buses for conveying digital signals between modules of the system.

BACKGROUND OF THE INVENTION

In digital electronic systems it is important to provide rapid communication between the different modules as the signal delays incurred in such communication can have a significantly adverse effect on the performance of the system. As systems become larger and more complex there is an increase in the number of modules connected to a bus conveying data or other signals from one module to another, with a consequent increase in the loading, usually capacitive, on the bus. In order to prevent the response time of the bus becoming lengthened unacceptably by the increased loading, the power outputs from the modules driving the bus need to be increased. The modules themselves are usually in integrated circuit form and the search for an increase in their speed of operation has led to their being made smaller. That reduction in size has meant a corresponding reduction in the loading on the buses to which the modules are connected, but the increase in speed that would be expected to result from the reduction in loading is not achieved, or is achieved only in part, because the reduction in size has also meant a reduction in the ability of the modules to drive the buses at the speeds required because of their smaller power outputs. That difficulty remains when the modules and the buses are all in the same integrated circuit.

It is an object of the present invention to overcome the above difficulty at least partially.

SUMMARY OF THE INVENTION

According to one aspect of the present invention there is provided a digital electronic system having a plurality of modules interconnected by a bus wherein the bus is divided into a plurality of sections each connected to at least one of the modules and at least one buffer is provided for transmitting signals on one section of the bus to another section of the bus in order that the loading of the other section of the bus is not imposed on the module or modules connected to the one section of the bus.

Each bus section may be connected to a plurality of modules. The modules may be divided into groups according to whether they feed signals to the bus, derive signals from the bus, or do both. The modules in any one group may be connected to one or more bus sections separate from that or those to which the modules in other groups are connected. That enables unidirectional buffers to be used for interconnecting to the remainder of the bus those sections to which modules that only feed signals to the bus are connected. Similarly unidirectional buffers can be used to join those sections connected to modules which only derive signals from the bus to the remainder of the bus. Otherwise bidirectional buffers are required to enable signal transfer to take place between the bus sections in both directions.

In particular, where the system includes several modules each having only a low power output to drive the bus, they may conveniently be connected to a common low capacitance bus section that is itself connected to the remainder of the bus through a buffer.

In a bidirectional buffer there is a difficulty because of the positive feedback which is produced by two amplifiers connected output to imput in a loop. The amplifiers together form a trigger circuit which in the absence of anything to control it would rapidly set and hold both busses high or low and would therefore prevent either bus carrying any data signals at all. That difficulty may be overcome by applying clock signals to the buffer to enable it to transmit a logic level from either bus section to the other only for the duration of each clock signal. When a clock signal terminates the triggering of the buffer is disabled and the bus section can again assume the logic levels applied to them by the modules.

A system according to the invention may be constructed as an integrated circuit. Conveniently, such a system may be constructed using dynamic MOS logic in which data bits are stored as charges on the gate capacitances of MOS transistors. In dynamic MOS logic the gates and the conductors connected to them are precharged and then selectively discharged according to the charges on the gates of the preceding devices in a two-phase or four-phase cycle.

Applying that logic technique to an example of a system according to the invention the separate buses are precharged by the same active low clock. The clock does two things: it disconnects the discharge paths to ground allowing the buses to be precharged and it also causes the buses to be precharged to a "high" voltage level. When the clock goes high again it stops the precharging and reconnects the discharge paths to ground, thereby enabling the buses to be discharged if so required by the MOS devices driving them.

The examples of buffers to be described are for use with the parts of a bus that have the same logic sense. The different parts of a bus do not have to have the same logic sense, that is to say the signals on one part of a bus may be of opposite logical sense to the signals on another part of the same bus.

One or more buffers in a system may include means responsive to a control signal to disable the transmission of logic signals from one part of a bus to another. The use of such buffers facilitates the testing of individual modules of the system by isolating a module under test from the other modules. Additional buffers of the same type may be used to apply test signals to an isolated module.

The buffers may be built into one or more modules of the system, and such a module may have a buffered connection for a first bus section and a direct connection or another buffered connection for a second bus section.

According to another aspect of the invention there is provided a digital module having a first output for connection to a first bus section and a second output for connection to a second bus section, the first output being connected to a circuit of the module through buffer means, and the second output also being connected to the circuit of the module, in order that signals on one bus section can be transmitted to the other bus section through the buffer means.

BRIEF DESCRIPTION OF THE DRAWINGS

In order that the invention may be fully understood and readily carried into effect, examples of it will now be described with reference to the accompanying drawings, of which.

DETAILED DESCRIPTION OF THE INVENTION

Figure 1:
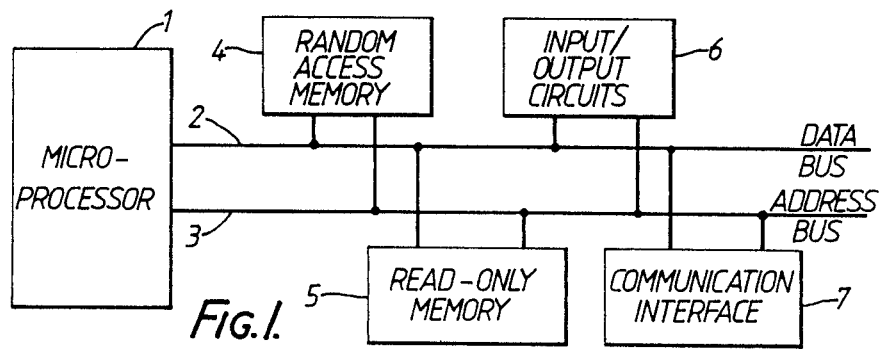
FIG. 1 is a block diagram of a conventional microcomputer having data and address buses providing communication between the different units.

A typical application for buses is a microcomputer, an example of which is shown in FIG. 1. In the microcomputer a microprocessor 1 is connected to data and address buses 2 and 3, for convenience shown as single lines although in practice they would each have a plurality of conductors. The microprocessor 1 is connected through these buses to a random access memory 4, read-only memory 5, input/output circuits 6 and a communication interface 7. The data bus 2 may have 4, 8, 16 or 32 conductors carrying respective bit signals for a 4, 8, 16 or 32 bit data word. The address bus similarly includes a plurality of conductors, say 12, 16, 24 or 32 conductors, carrying respective bit signals for an address having a corresponding number of bits. The number of conductors in the two buses is determined by the design of the microprocessor 1 and the construction of the other units is arranged to match the buses suited to the microprocessor 1. The microcomputer is so designed according to well-established principles that all of the conductors of both buses are connected to each of the units of the microcomputer.

Figure 2:
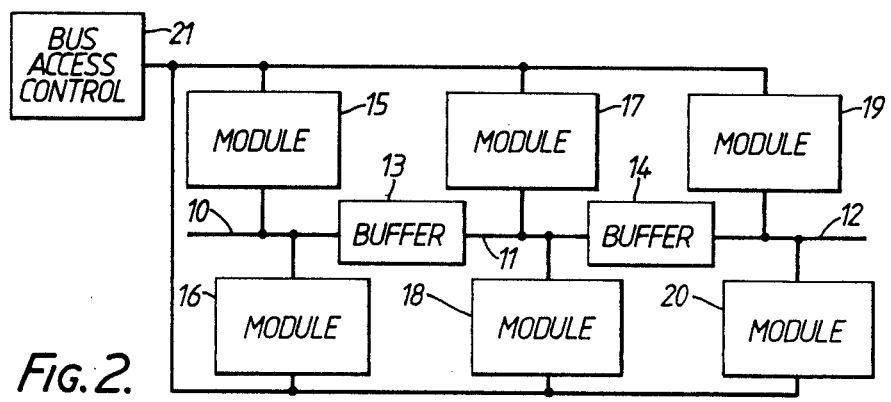
FIG. 2 is a block diagram of a number of digital modules connected to a common bus which is divided into three sections by two buffers.

FIG. 2 shows an example of an apparatus according to the present invention, in which a bus, which may include a plurality of conductors for carrying a multi-bit number in parallel, is divided into three sections 10, 11 and 12. A first buffer 13 is connected between the sections 10 and 11, and a second buffer 14 is connected between the sections 11 and 12. Two circuit modules 15 and 16 are connected to the section 10. Two circuit modules 17 and 18 are connected to the section 11. Two circuits modules 19 and 20 are connected to the section 12. A bus access control circuit 21 is connected to all the modules to enable a selected one module at a time to feed signals to the bus.

It should be understood that FIG. 2 is purely diagrammatic and shows only those parts of the apparatus which are relevant to the invention and relate to the bus. The six circuit modules 15 and 20 may be of similar or different designs depending on the apparatus, but they are all units capable of feeding digital signals to and/or receiving digital signals from the bus section to which they are converted. Certain of the modules may only be able to feed signals to the bus section to which they are connected, others may only be able to receive signals from the bus section to which they are connected, and the rest can both feed signals to and receive signals from the bus section to which they are connected.

It will be clear that when the module 15, say feeds a signal to the bus section 10, it must drive it with sufficient power to produce the required level changes on the conductors of the bus section 10 despite the loading on those conductors resulting from the input circuits of the module 16 and the buffer 13. If the buffers 13 and 14 were not provided and the bus sections 10, 11 and 12 were connected directly to each other, the module 15 would have to drive the input circuits of all the other modules receiving signals from the bus. The buffers 13 and 14 therefore serve to reduce significantly the loading on the output circuits of the modules driving the bus. This reduction is the more important when the apparatus is formed on one or more integrated circuits because higher power output circuits inevitably occupy more chip area and such output circuits have to be provided in each module driving the bus.

The buffers 13 and 14 may be unidirectional or bidirectional depending on which of the modules 15–20 is able only to drive the bus and which of them is able only to receive signals from the bus. For example, if the modules 15 and 16 can only feed signals to the bus, the modules 19 and 20 can only receive signals from the bus, and the modules 17 and 18 can both feed signals to and receive signals from the bus, then both the buffers 13 and 14 need only be unidirectional ones. A bidirectional buffer would be needed if transmission of signals were required in both directions through the buffer.

The detailed design of different types of buffers will now be described with reference to FIGS. 3, 4 and 5 which show the construction of a buffer for a signal conductor of the bus. If the bus were to consist of 8 conductors, for example, then the circuits shown would be repeated 8 times to form the whole buffer. The designs are intended for fabrication using CMOS technology and to link two dynamic MOS buses of the same logical sense.

Figure 3:
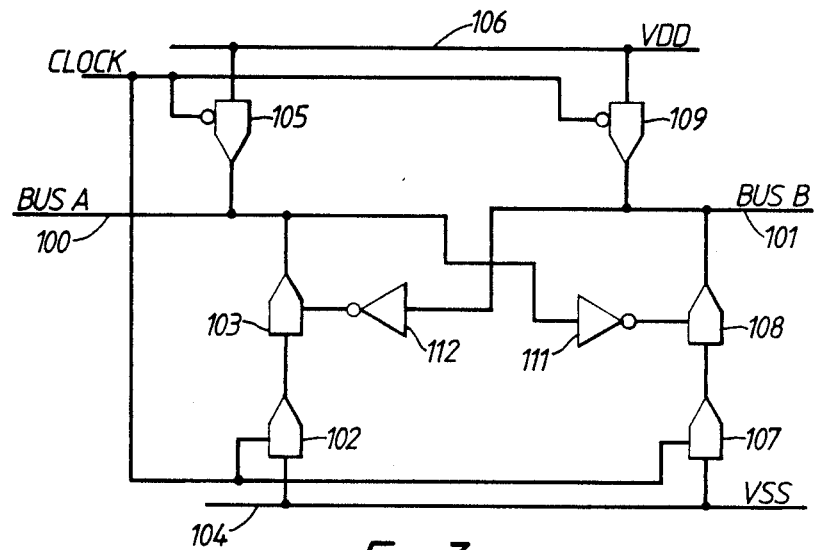
FIG. 3 is the circuit diagram of a bidirectional buffer.

FIG. 3 shows a bidirectional buffer interconnecting a conductor 100 of a first bus section A and a conductor 101 of a second bus section B. The pentagon symbols represent MOS field effect transistors, of which the drain and source are respectively indicated by the point and the square cut end of the pentagon, and the gate is indicated by the connection to the side of the pentagon. If the gate connection is direct then the transistor is an n-channel enhancement type and if the gate connection is through an inverting circle then the transistor is a p-channel enhancement type.

The source-drain paths of n-channel transistors 102 and 103 are connected in series from a negative supply conductor 104 to the conductor 100. The source-drain path of p-channel transistor 105 is connected from a positive supply conductor 106 to the conductor 100.

The source-drain paths of n-channel transistors 107 and 108 are connected in series from the negative supply conductor 104 to the conductor 101. The source-drain path of a p-channel transistor 109 is connected from the positive supply conductor 106 to the conductor 101.

Clock signals used for the dynamic MOS logic in the modules connected to the conductors 100 and 101 are applied via a conductor 110 to the gates of the transistors 102, 105, 107 and 109.

The conductor 100 is connected through an inverter 111 to the gate of the transistor 108. The conductor 101 is connected through an inverter 112 to the gate of the transistor 103.

In the operation of the buffer shown in FIG. 3, when the level of the clock is low the transistors 105 and 109 are conducting, precharging the conductors 100 and 101 of the bus sections A and B to the voltage of the positive supply conductor 106. A bus access control circuit 21 (FIG. 2) is provided to determine which of the modules connected to the conductors 100 and 101 is permitted to feed signals to them at a particular time. Assuming that a module connected to the conductor 100 and the other conductors of the bus section A is permitted to feed signals to conductors, then the output circuits of that module selectively discharge the conductors of the bus section A when the clock level goes high.

At that time the transistors 102 and 107 become conducting, but the transitor 103 remains non-conducting, being held in that state by the high, precharge level, on the conductor 101 because none of the modules connected to the bus section B is permitted to feed signals to it. The transistor 108 receives on its gate the inverted level on the conductor 100 and therefore discharges the conductor 101 to the level of the conductor 104 if the conductor 100 is low or leaves it at the precharge level if the conductor 100 is high. Thus, when the clock level goes high the buffer sets the conductor 101 to the level of the conductor 100. Similarly, if a module connected to the bus section B were to have been permitted to feed signals to the conductors of the bus then the buffer would have caused the conductor bus 100 to adopt the level of the conductor 101 by control of the conductivity of the transistor 103.

The transistors 102 and 107 controlled by the clock serve to disable the regenerative connection of the transistors 103 and 108 through the inverters 111 and 112, which otherwise would prevent any change in the voltage levels on the conductors of the bus sections A and B. While the clock level is high the regeneration will, after a low level has been established on the conductors 100 and 101, help to maintain it.

Figure 4:
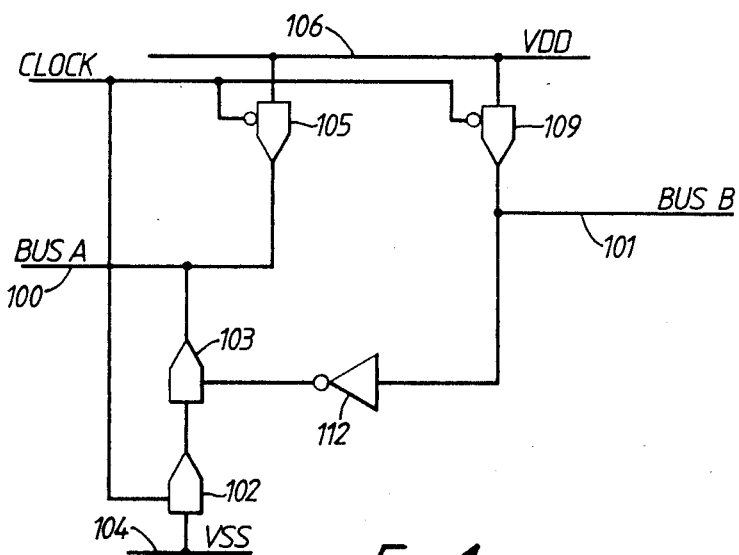
FIG. 4 is the circuit diagram of a unidirectional buffer providing communication from a bus section B to a bus section A.

FIG. 4 shows a unidirectional buffer of similar construction to one half of the bidirectional buffer shown in FIG. 3. The components of the buffer shown in FIG. 4 carry the same references as the corresponding components of FIG. 3. The buffer shown in FIG. 4 will set the level of the conductor 100 to be that of the conductor 101 when the clock level goes high. The circuit includes the transistor 109 for precharging the conductor 101, but there are no components for discharging the conductor 101 to a low level in response to a low level on the conductor 100.

There may be occasions when it is required to isolate a section of a bus from another section of the bus, for example in order to test the functioning of one or more of the modules connected to the particular section of the bus without the possibility of interference from other modules. That may be achieved by the use of the buffer shown in FIG. 5, which is a modification of that shown in FIG. 4.

Figure 5:
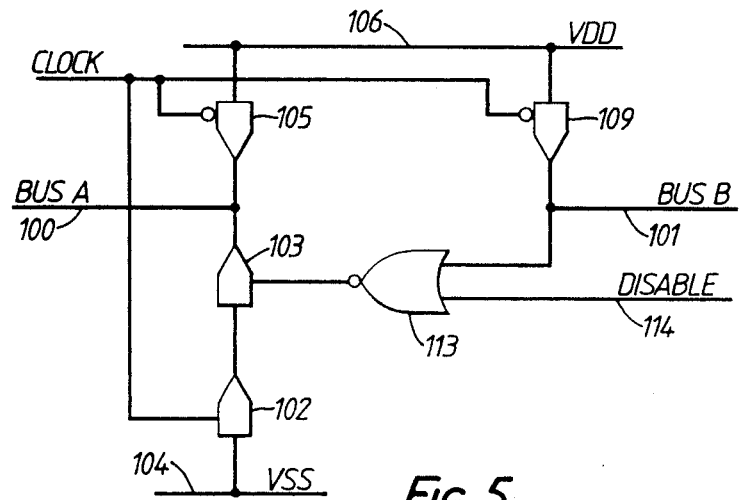
FIG. 5 is the circuit diagram of a unidirectional buffer like that shown in FIG. 4, modified to enable the bus sections A and B to be isolated from each other.

Components in FIG. 5 which correspond to components in FIG. 4 have the same references as in that figure. The modification is that the inverter 112 of FIG. 4 is replaced by a 2-input NOR gate 113, of which one input is connected to the conductor 101 and the other input is connected to a conductor 114 to which a "DISABLE" signal is applied. When the "DISABLE" signal is high the output from the NOR gate 113 is low regardless of the level on the conductor 101, so that data cannot be passed through the buffer to the conductor 100 and the levels on the conductors 100 and 101 can vary independently of one another.

The bidirectional buffer of FIG. 3 may be modified by the replacement of one or both of the inverters 111 and 112 by 2-input NOR gates with a "DISABLE" signal input to the, or each, gate as in FIG. 5. Where both inverters are replaced by NOR gates the "DISABLE" signal inputs may be commoned. If the "DISABLE" inputs are kept separate, independent control of signal transmission in the two directions through the buffer is possible.

Although in the examples described above the logical senses of the two bus sections interconnected by the buffers are the same, the buffers could be modified to interconnect buffer sections having opposite logical senses.

The invention is of particular value where all the modules are formed on the same integrated circuit because the reduction in the size of the transistors driving the bus sections which the invention makes possible is repeated for every module driving the bus.

I claim:

1. A digital electronic system having a plurality of modules interconnected by a bus wherein the bus is divided into a plurality of sections, each of said sections connected to a module and buffer such that said buffer is connected serially between two of said sections, and wherein said buffer is provided for transmitting signals on a first section of the bus to a second section of the bus in order that the loading of said second section of the bus is not imposed on said module connected to said first section of the bus, and further comprising receiving means for receiving a clock signal, wherein said buffer transmits said signal responsive to a clock signal received by said receiving means.

2. A system according to claim 1, wherein the plurality of modules comprises a first plurality, and wherein each bus section is connected to a second plurality of modules.

3. A system according to claim 1 wherein said module connected to said first section of the bus comprises one module in a first group of modules, each capable only of feeding signals to the first section of the bus, wherein said buffer comprises a first buffer means provided for transmitting signals from said first section of the bus to said second section of the bus, the first buffer means being capable only of unidirectional signal transmission.

4. A system according to claim 3 wherein the plurality of modules comprises a second group of modules connected to a second section of the bus, wherein second buffer means is provided for transmitting signals to the second section of the bus from another section of the bus, which may be, but is not necessarily, the first section of the bus, the second buffer means being capable only of unidirectional signal transmission.

5. A system according to claim 1 wherein said buffer comprises buffer means capable of bidirectional signal transmission for transmitting signals between two sections of the bus.

6. A system according to claim 5, wherein the buffer means capable of bidirectional signal transmission is responsive to a clock signal received by said receiving means in such a way that only during a clock signal can the buffer means transmit signal levels established on one bus section to which it is connected to the other bus section to which it is connected.

7. A system according to claim 6 in which the plurality of modules are constructed using MOS dynamic logic and the respective bus section to which a module is connected to apply signals thereto is precharged by precharging means connected between the module and the respective bus section and in response to a common active low clock, said precharging means comprising means for disconnecting the bus section from discharge paths to ground and means for connecting a charging circuit to the bus section, the module applying signals to the bus section by selectively discharging it after the clock signal.

8. A system according to claim 1 wherein said buffer is provided with means for disabling the transmission of signals from one to the other sections of the bus to which it is connected.

* * * * *